US012288272B2

(12) United States Patent
Dietzel et al.

(10) Patent No.: US 12,288,272 B2
(45) Date of Patent: Apr. 29, 2025

(54) METHOD FOR DETERMINING A PRODUCTION AERIAL IMAGE OF AN OBJECT TO BE MEASURED

(71) Applicant: Carl Zeiss SMT GmbH, Oberkochen (DE)

(72) Inventors: Martin Dietzel, Giengen a. d. Brenz (DE); Renzo Capelli, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 556 days.

(21) Appl. No.: 17/547,762

(22) Filed: Dec. 10, 2021

(65) Prior Publication Data

US 2022/0101569 A1 Mar. 31, 2022

Related U.S. Application Data

(63) Continuation of application No. PCT/EP2020/065279, filed on Jun. 3, 2020.

(30) Foreign Application Priority Data

Jun. 12, 2019 (DE) .......................... 102019208552.0

(51) Int. Cl.
*G06T 11/00* (2006.01)
*G03F 7/00* (2006.01)

(52) U.S. Cl.
CPC .......... *G06T 11/00* (2013.01); *G03F 7/70091* (2013.01); *G03F 7/705* (2013.01); *G03F 7/70666* (2013.01)

(58) Field of Classification Search
CPC ........ G03F 1/84; G03F 7/705; G03F 7/70091; G03F 7/70191; G03F 7/70666;
(Continued)

(56) References Cited

U.S. PATENT DOCUMENTS

2003/0164933 A1 9/2003 Nishi et al.
2006/0066841 A1* 3/2006 Slonaker ............ G02B 27/0012
356/124
(Continued)

FOREIGN PATENT DOCUMENTS

DE 102 20 815 11/2003 ............... G21K 7/00
DE 102012213368 12/2013 ............. G02B 26/08
(Continued)

OTHER PUBLICATIONS

The Office Action issued by the Japanese Patent Office for Application No. JP 2021-573375, dated Jan. 29, 2024 (with English Translation).
(Continued)

*Primary Examiner* — Deoram Persaud
(74) *Attorney, Agent, or Firm* — Fish & Richardson P.C.

(57) ABSTRACT

In order to determine a production aerial image of an object to be measured as a result of an illumination and imaging with illumination and imaging conditions of an optical production system, firstly a measurement aerial image of the object to be measured is captured. This is carried out with illumination and imaging conditions of an optical measurement system, which conditions include a predefined measurement illumination setting. Data of the measurement aerial image are generated during the capturing. An object structure of the object to be measured is reconstructed from the data of the captured measurement aerial image by use of a reconstruction algorithm. Data of the reconstructed object structure are generated during the reconstructing. A production aerial image is simulated from the data of the reconstructed object structure with the illumination and imaging conditions of the optical production system. Said conditions include a production illumination setting, which is different than the measurement illumination setting. This results in a determining method in which the requirements made of an
(Continued)

optical measurement system used in the determining method, even under demanding illumination and imaging conditions of the optical production system, are relaxed.

20 Claims, 4 Drawing Sheets

(58) Field of Classification Search
CPC ..... G01N 21/956; Y02E 10/50; Y04S 10/123; G06T 11/00; G06T 11/003; H02J 2300/26; H02J 3/381; H02J 7/00306; H02J 7/35
See application file for complete search history.

(56) References Cited

U.S. PATENT DOCUMENTS

| | | |
|---|---|---|
| 2007/0032896 A1* | 2/2007 | Ye .......................... G03F 7/705 716/54 |
| 2012/0054697 A1 | 3/2012 | Takahata et al. |
| 2012/0133915 A1 | 5/2012 | Matsuyama et al. |
| 2012/0137260 A1* | 5/2012 | Pang ........................ G03F 1/36 716/52 |
| 2012/0320358 A1 | 12/2012 | Ruoff |
| 2013/0063716 A1 | 3/2013 | Mann et al. |
| 2017/0131528 A1 | 5/2017 | Ruoff et al. |
| 2017/0132782 A1 | 5/2017 | Metejka et al. |
| 2017/0270230 A1 | 9/2017 | Rosenbluth |
| 2018/0164207 A1 | 6/2018 | Blumrich et al. |
| 2019/0011615 A1 | 1/2019 | Hellweg et al. |
| 2019/0107776 A1 | 4/2019 | Thaler et al. |
| 2021/0349395 A1* | 11/2021 | Warnaar ............. G03F 7/70625 |
| 2022/0057709 A1* | 2/2022 | Koch ........................ G03F 1/84 |
| 2022/0342317 A1* | 10/2022 | Roesch ................. G01B 11/02 |
| 2022/0390320 A1* | 12/2022 | Koch ................. G01M 11/0264 |

FOREIGN PATENT DOCUMENTS

| | | | |
|---|---|---|---|
| DE | 102010029049 | 3/2014 | ............ G02B 17/00 |
| DE | 102016209616 | 12/2017 | ............ G06F 17/50 |
| JP | 9-26554 | 1/1997 | ............ G02B 27/18 |
| JP | 2002-006226 | 9/2002 | |
| JP | 2012-054418 | 3/2012 | ........... H01L 21/027 |
| JP | 2014-075444 | 4/2014 | ........... H01L 21/027 |
| JP | 2015-172750 | 10/2015 | ............... G03F 7/20 |
| JP | 2015-222428 | 12/2015 | ............... G03F 7/20 |
| WO | WO 2016/012425 | 1/2016 | ............ G02B 17/08 |
| WO | WO 2017/207297 | 12/2017 | ............... G03F 1/84 |

OTHER PUBLICATIONS

The Examination Report issued by the German Patent Office for Application No. DE 102019208552.0, dated Feb. 26, 2021 (with English Translation).
The Office Action and Search Report issued by the Taiwan Patent Office for Application No. TW 109119686 dated Mar. 5, 2021 (with English Translation).
The International Search Report for International Application No. PCT/EP2020/065279, dated Aug. 31, 2020.
Van den Broek et al., "General framework for quantitative three-dimensional reconstruction from arbitrary detection geometries in TEM", *Physical Review*, vol. B87, pp. 184108-1-184108-11 (2013).
Zhang et al., "Source mask optimization methodology (SMO) and application to real full chip optical proximity correction", *Proceedings of SPIE*, vol. 8326, pp. 83261V-1-83261V-11 (Aug. 8, 2019).
The Office Action issued by the German Patent Office for Application No. DE 10 2019 208 552.0, dated Sep. 5, 2024 (with English Machine Translation).
The Office Action issued by the Japanese Patent Office for Application No. JP 2021-573375, dated Aug. 1, 2024 (with English Machine Translation).

* cited by examiner

METHOD FOR DETERMINING A PRODUCTION AERIAL IMAGE OF AN OBJECT TO BE MEASURED

CROSS-REFERENCE TO RELATED APPLICATIONS

This application is a continuation of and claims priority under 35 U.S.C. § 120 from PCT Application No. PCT/EP2020/065279, filed on Jun. 3, 2020, which claims priority from German Patent Application DE 10 2019 208 552.0, filed on Jun. 12, 2019. The entire contents of the above applications are incorporated herein by reference.

TECHNICAL FIELD

The invention relates to a method for determining a production aerial image of an object to be measured as a result of an illumination and imaging with illumination and imaging conditions of an optical production system. Furthermore, the invention relates to a metrology system comprising an optical measurement system for carrying out the method.

BACKGROUND

A metrology system is known from US 2017/0131528 A1 (parallel document WO 2016/0124425 A2) and from US 2017/0132782 A1. WO 2017/207297 A1 discloses a method for predicting an imaging result of a lithography mask.

SUMMARY

It is an aspect of the present invention to develop a determining method of the type mentioned in the introduction in such a way that the requirements directed to an optical measurement system used in the determining method, even under demanding illumination and imaging conditions of the optical production system, are relaxed.

This aspect is achieved according to the invention by use of a determining method having the features specified in Claim 1.

According to the invention, it has been recognized that it is possible to carry out a determination of a production aerial image even for demanding illumination and imaging conditions of the optical production system using an optical measurement system in which a different measurement illumination setting in comparison with a production illumination setting is used. The measurement illumination setting can then be configured such that it is able to be realized more simply within the optical measurement system, with the result that the requirements directed to the optical measurement system overall are relaxed. It is possible, in particular, to simulate production aerial images which, in a measurement set-up, would not be able to be realized, or would be able to be realized only with difficulty, since this would require for example a stop structure not able to be fabricated, or able to be fabricated only with difficulty, in the measurement set-up.

On the basis of the simulated production aerial image, that is to say on the basis of the result of the determining method, the object structure of the measured object can be optimized until the simulated production aerial image corresponds to a predefined aerial image. The determining method can thus be part of an iterative process for optimizing an object structure until the object structure has been optimized for the illumination and imaging conditions of the optical production system for generating an image structure, which in turn, for example if the optical production system is used for producing micro- or nanostructured semiconductor components, is a starting point for the production of correspondingly structured semiconductor components with extremely high resolution.

The measurement illumination setting includes a predefined numerical illumination aperture of the optical measurement system. Said predefined illumination aperture is predefined by an edge contour of the illumination pupil.

In the determining method, it is possible to use a reconstruction method for an object structure known from the technical article "Method for Retrieval of the Three-Dimensional Object Potential by Inversion of Dynamical Electron Scattering" by Van den Broek et al., Phys. Rev. Lett. 109, 245502 (2012) and also from WO 2017/207 297 A1.

In the optimization of the object structure, by way of example, object defects can be identified and optionally repaired.

A predefinition of a measurement illumination setting by a setting stop according to Claim 2 has proved worthwhile.

A production illumination setting having an elliptic edge contour of an illumination pupil according to Claim 3 is one example of a demanding production illumination setting.

The same applies, mutatis mutandis, to a freeform or SMO (Source Mask Optimization) illumination setting according to Claim 3. Such a freeform illumination setting cannot be described by any of the standardized illumination settings "conventional," "annular," "dipole" or "multipole," but rather is distinguished by a free shaping of the arrangement of pupil regions on which illumination light impinges within the illumination pupil. With regard to the SMO methodology, reference is made to the technical article "Source mask optimization methodology (SMO) and application to real full chip optical proximity corrections" by D. Zhang et al., Proceedings SPIE 8326, Optical Microlithography XXV, 83261V (13 Mar. 2012).

A production illumination setting with varying illumination intensity according to Claim 5 is a further example of a demanding production illumination setting. The minimum illumination intensity can be greater than 1% or else greater than 10% of the maximum illumination intensity. The minimum illumination intensity can be less than 50% of the maximum illumination intensity.

A production illumination setting according to claim 6 has proved worthwhile within an optical production system. The illuminated individual regions within the illumination pupil can be arranged separately from one another.

It is virtually impossible or not possible at all for such a production illumination setting to be predefined by way of a setting stop since a production outlay for a setting stop of this type, if such a setting stop were producible in the first place, would be enormously high.

Individual region configurations or individual region arrangements according to Claims 7 to 9 have likewise proved worthwhile when predefining a production illumination setting. The individual regions can have a circular boundary; however, this is not mandatory.

The advantages of a metrology system according to Claim 10 correspond to those that have already been explained above with reference to the convergence method according to the invention.

The metrology system can measure a lithography mask provided for projection exposure for producing semiconductor components with an extremely high structure resolution, which for example is better than 30 nm and which in particular can be better than 10 nm.

A metrology system according to claim 11 is flexibly usable. The metrology system can comprise a plurality of changeable setting stops, which can be exchanged for one another in an automated manner by way of a changing mount.

BRIEF DESCRIPTION OF DRAWINGS

An exemplary embodiment of the invention is explained in greater detail below with reference to the drawings. In said drawings.

DETAILED DESCRIPTION

Figure 1:
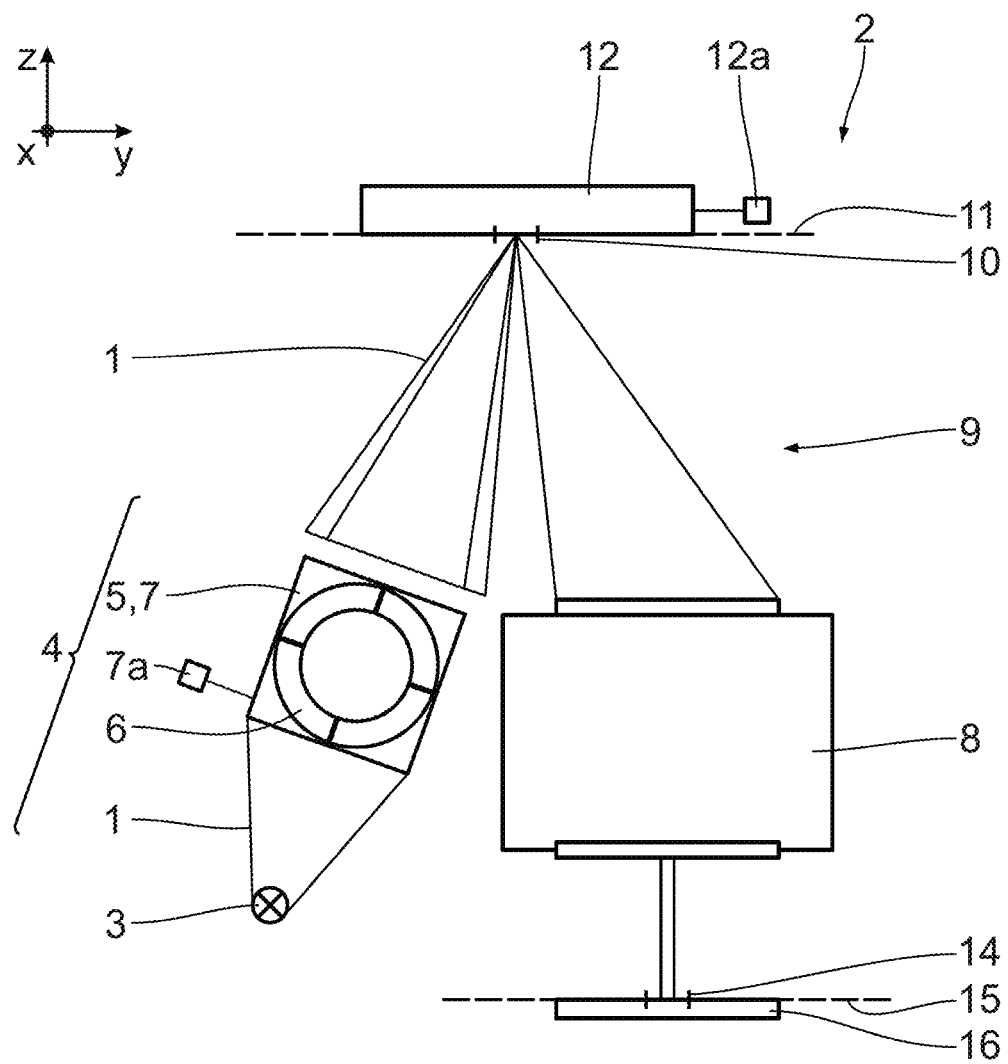
FIG. 1 schematically shows a metrology system for determining an aerial image of an object to be measured in the form of a lithography mask, comprising an illumination system, an imaging optical unit and a spatially resolving detection device.

FIG. 1 shows, in a sectional view corresponding to a meridional section, a beam path of EUV illumination light or imaging light 1 in a metrology system 2. The illumination light 1 is produced by an EUV light source 3.

In order to facilitate the presentation of positional relationships, a Cartesian xyz-coordinate system is used hereinafter. In FIG. 1, the x-axis runs perpendicularly to the plane of the drawing and out of the latter. The y-axis runs towards the right in FIG. 1. The z-axis runs upwards in FIG. 1.

The light source 3 can be a laser plasma source (LPP; laser produced plasma) or a discharge source (DPP; discharge produced plasma). In principle, a synchrotron-based light source can also be used, for example a free electron laser (FEL). A used wavelength of the illumination light 1 can be in the range of between 5 nm and 30 nm. In principle, in the case of a variant of the projection exposure apparatus 2, it is also possible to use a light source for some other used light wavelength, for example for a used wavelength of 193 nm.

In an illumination optical unit (not illustrated in more specific detail) of an illumination system of the metrology system 2, to which the light source 3 also belongs, the illumination light 1 is conditioned such that a specific illumination setting 5 of the illumination is provided, that is to say a specific illumination angle distribution. Said illumination setting 5 corresponds to a specific intensity distribution of the illumination light 1 in an illumination pupil of the illumination optical unit of the illumination system 4.

One example of the illumination setting 5 is indicated in FIG. 1 schematically in a manner lying in the plane of the drawing as an annular illumination setting provided with webs and having a total of four illumination poles 6 shaped approximately as quadrants. The illumination pupil in which the illumination setting 5 is present is actually arranged perpendicularly to the plane of the drawing in FIG. 1 and perpendicularly to the direction of propagation of the illumination light 1 through the illumination pupil.

In the illumination pupil there is a predefined illumination intensity in each case at the location of the illumination poles 6, otherwise no illumination intensity. The illumination setting 5 can be predefined by a setting stop 7, which is transmissive to the illumination light 1 at the location of the illumination poles 6 and blocks the illumination light in the surroundings of the illumination poles 6. One example of such a setting stop 7 is a metal sheet having passage openings, the shape of which corresponds exactly to the shape of the illumination poles 6. The setting stop is arranged in a pupil plane of the illumination optical unit of the metrology system 2.

With the aid of a changing holder 7a indicated in FIG. 1, the setting stop 7 can be exchanged for an exchange setting stop for changing the respective measurement illumination setting.

Instead of the quadrupole illumination setting 5 illustrated, by use correspondingly with differently shaped and/or distributed passage openings, it is also possible to predefine other illumination settings within the metrology system 2, for example a conventional illumination setting in which practically all illumination angles are used for object illumination, in particular with the exception of illumination angles close to perpendicular or average incidence on the object to be illuminated, an annular illumination setting with small illumination angles overall, that is to say illumination angles close to perpendicular or average incidence, which itself can in turn be omitted, or dipole illumination settings, wherein the individual poles can each have a "leaflet" contour, that is to say an edge contour that corresponds approximately to the section through a biconvex lens element.

Together with an imaging optical unit or projection optical unit 8, the illumination system 4 constitutes an optical measurement system 9 of the metrology system 2.

With the illumination setting 5 respectively set, the illumination light 1 illuminates an object field 10 of an object plane 11 of the metrology system 2. A lithography mask 12, also referred to as a reticle, is arranged as a reflective object in the object plane 11. The object plane 11 runs parallel to the x-y-plane.

Figure 3:
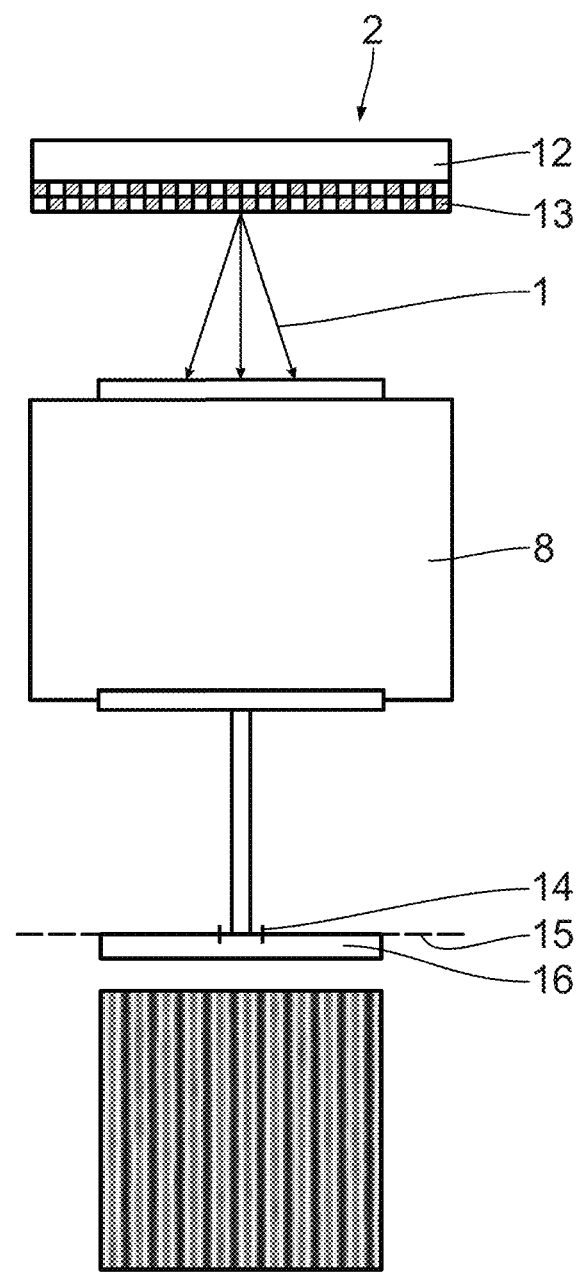
FIG. 3 shows in greater detail, but still schematically, an imaging of the lithography mask with the imaging optical unit of the metrology system according to FIG. 1.

In FIG. 3, which shows more specific details for guiding the imaging light 1 through the projection optical unit 8 of the metrology system 2, object structures 13 on the object which are to be imaged, facing the projection optical unit 8, are indicated as line structures running perpendicularly to the plane of the drawing in FIG. 3.

The illumination light 1 is reflected from the lithography mask 12, as illustrated schematically in FIG. 1, and enters an entrance pupil of the imaging optical unit 8 in an entrance pupil plane. The used entrance pupil of the imaging optical unit 8 can have a circular or else elliptic boundary.

Within the imaging optical unit 8, the illumination or imaging light 1 propagates between the entrance pupil plane and an exit pupil plane. A circular exit pupil of the imaging optical unit 8 lies in the exit pupil plane.

The imaging optical unit 8 images the object field 10 into an image field 14 in an image plane 15 of the metrology system 2. A magnifying imaging scale during the imaging by the projection optical unit 8 is greater than 500. Depending on the embodiment of the projection optical unit 8, the magnifying imaging scale can be greater than 100, can be greater than 200, can be greater than 250, can be greater than 300, can be greater than 400 and can also be significantly greater than 500. The imaging scale of the projection optical unit 8 is regularly less than 2000.

The projection optical unit 8 serves for imaging a section of the object 12 into the image plane 15.

A spatially resolving detection device 16 of the metrology system 2 is arranged in the image plane 15. This may involve a CCD camera.

The metrology system 2 having the optical measurement system 9 is used for carrying out a method for determining an aerial image of the object 12 to be measured as a result of illumination and imaging with illumination and imaging conditions of an optical production system of an EUV projection exposure apparatus (not illustrated). The aerial image of the object 12 generated by the optical production system of the production projection exposure apparatus can thus be simulated or emulated with the aid of the metrology system 2.

Figure 2:
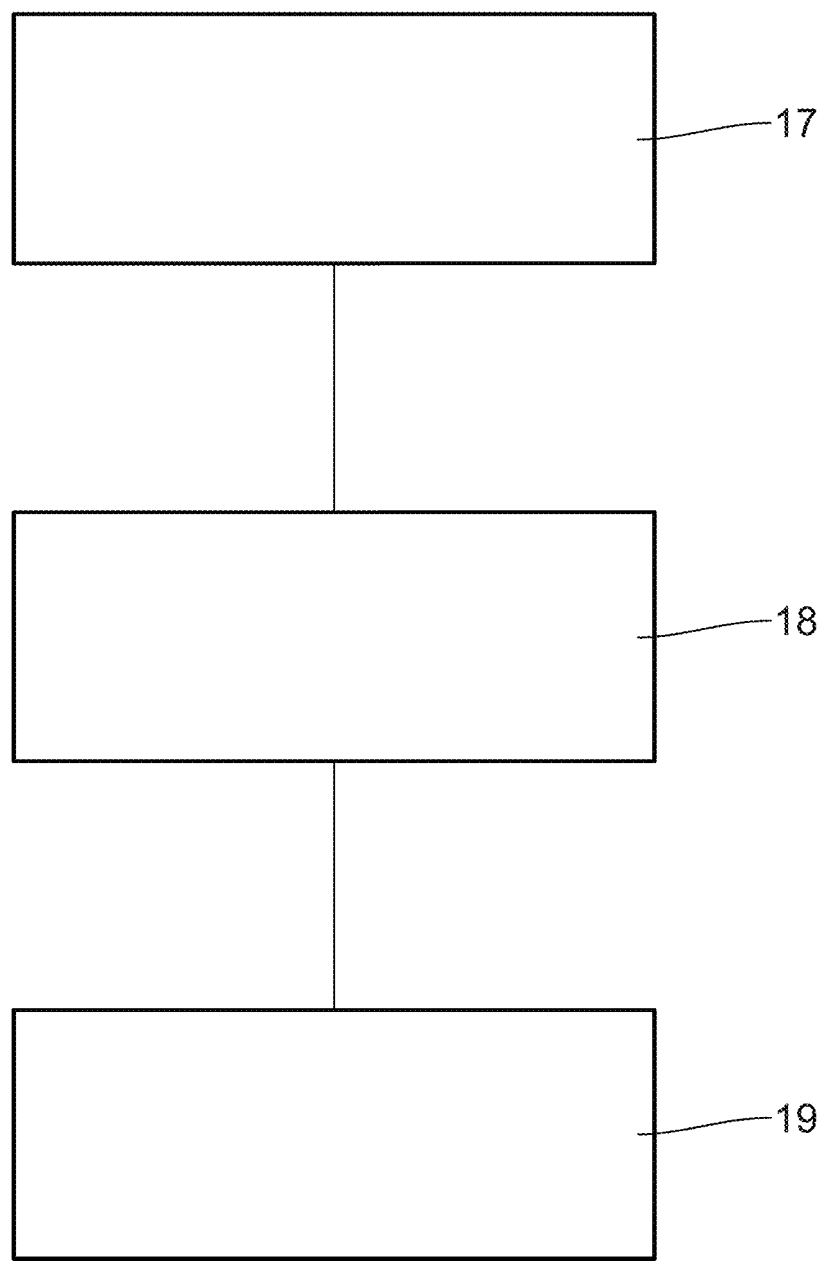
FIG. 2 shows a sequence of main method steps of a method in which the metrology system according to FIG. 1 is used, for determining an aerial image of an object to be measured as a result of an illumination and imaging with illumination and imaging conditions of an optical production system.

Main steps of this method are explained below with the aid of FIGS. 2 and 4 as well.

In a capturing step 17, the metrology system 2 captures a measurement aerial image I (x, y) of the object 12 to be measured with the illumination and imaging conditions of the optical measurement system 9. In this case, the measurement aerial image is captured with a predefined measurement illumination setting, for example with the illumination setting 5. Intensity data I (x, y) of the measurement aerial image are generated during this capturing.

A subsequent reconstruction step 18 of the determining method involves reconstructing an object structure 13 in the form of a transfer function $T_{Mask}$ (x, y) of the object 12 to be measured from the data I (x, y) of the captured measurement aerial image by use of a reconstruction algorithm. Data of the reconstructed object structure 13 are generated during this reconstruction step 18. Such an object structure reconstruction algorithm from captured measurement aerial image data is described in the technical article "Method for Retrieval of the Three-Dimensional Object Potential by Inversion of Dynamical Electron Scattering" by Van den Broek et al., Phys. Rev. Lett. 109, 245502 (2012). This reconstruction algorithm can also be applied to lithography masks. In this context, reference is made to WO 2017/207297 A1.

In a subsequent simulation step 19 of the determining method, an electric field $E_I$ (x, y) of a production aerial image, that is to say of an aerial image obtained by use of the optical production system of the production projection exposure apparatus, is simulated from the data $T_{Mask}$ of the reconstructed object structure 13 with the illumination and imaging conditions of the optical production system. Said illumination and imaging conditions of the optical production system include a production illumination setting 19a (cf. FIG. 4), which differs from the measurement illumination system 5.

Figure 4:
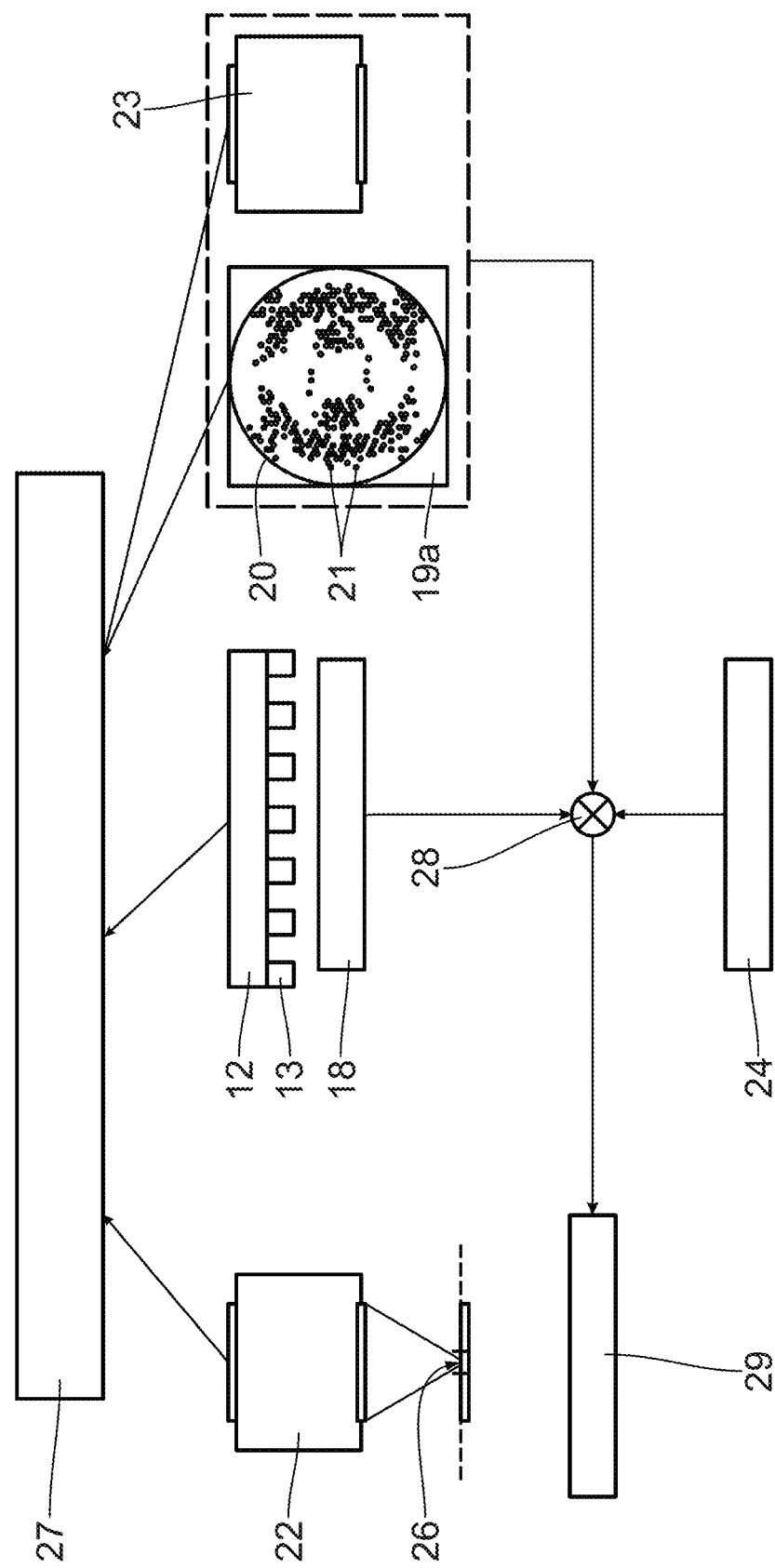
FIG. 4 shows a schematic visualization of input variables that influence a determined production aerial image, namely in particular data concerning an optical production system which images the object to be measured, data of a reconstructed object structure and also data concerning illumination conditions of the optical production system with a production illumination setting, which differs from a measurement illumination setting of the metrology system according to FIG. 1.

The production illumination setting 19a, which is illustrated by way of example in FIG. 4, has a circular edge contour 20. Alternatively, a production illumination setting having an edge contour deviating from the circular shape, for example having an elliptic edge contour, can be used.

The production illumination setting 19a illustrated in FIG. 4 is a freeform illumination setting. Such a freeform illumination setting cannot be described by any of the standardized illumination settings "conventional," "annular," "dipole" or "multipole." The freeform production illumination setting 19a has a multiplicity of illuminated individual regions 21 within the edge contour 20 of the production illumination pupil. The individual regions 21 are arranged in the manner of selected grid points of a point grid that completely covers the illumination pupil within the edge contour.

Each of the illuminated individual regions 21 has the same typical diameter. The typical diameter of the individual regions 21 can be in the range of between 0.5% and 10% of the total pupil area.

The illuminated individual regions 21 can have a circular boundary. The illuminated individual regions 21 are arranged in a manner distributed irregularly over the illumination pupil within the edge contour 20. The illuminated individual regions 21 are arranged in a manner distributed over the illumination pupil with varying surface density within the edge contour 20.

In the case of the illumination setting 19a, all the illuminated individual regions are illuminated with the same illumination intensity. In the case of an alternative production illumination setting, an illumination intensity can vary in particular continuously over illuminated regions of the illumination pupil in the range between a minimum illumination intensity and a maximum illumination intensity, wherein the minimum illumination intensity is greater than 0.

In the case of a production illumination setting which otherwise corresponds to the production illumination setting 19a, this variation of the illumination intensity can be achieved by the different individual regions 21 being illuminated with different illumination intensities. In this case, certain individual regions from among the individual regions 21 can be illuminated with the maximum illumination intensity and other individual regions 21 can be illuminated with lower illumination intensity, for example with 90%, 80%, 70%, 60%, 50%, 40%, 30%, 20%, 10%, 5%, 1% of the maximum illumination intensity. In this case, the different individual regions 21 can be illuminated with differently gradated illumination intensity or else a continuous variation of the illumination intensity is possible. With the use of a gradated illumination intensity, two steps, three steps, four steps, five steps, six steps, seven steps, eight steps, nine steps, ten steps or even more steps can be used.

The simulation of the production aerial image I (x, y) is also influenced by data concerning the imaging conditions of a projection optical unit 22 of the production projection exposure apparatus. The production projection optical unit 22, which generally differs greatly from the measurement projection optical unit 8 of the metrology system 2, is illustrated schematically on the far left in FIG. 4. Alternatively, it is also possible to use a measurement projection optical unit that corresponds to the production projection optical unit.

An image-side numerical aperture of the production projection optical unit 22 can be in the range of between 0.3 and 0.9, for example 0.33, 0.4, 0.45, 0.5, 0.55, 0.6, 0.65, 0.7. An imaging factor of the production projection optical unit 22 can be less than 1, such that the production projection optical unit 22 images the object structure 13 in a reduced fashion into an image field 26 of the production projection exposure apparatus. This reduction can be four-fold, for example, thus resulting in an imaging scale of 0.25. Other imaging scales in the range of between 0.1 and 0.5 are also possible.

Besides the production illumination setting 19a, the simulation step 19 is also influenced by even further illumination conditions of the optical production system of the production projection exposure apparatus, in particular an apparatus function of an illumination system 23 of the production projection exposure apparatus. Said apparatus function is influenced by data of the EUV light source and also data of the illumination and projection optical unit of the production projection exposure apparatus. Such data are, e.g., data concerning the uniformity of the illumination, that is to say data representing a measure of how well an actual illumination intensity over the object field to be illuminated corresponds to a desired illumination intensity. These data can furthermore include data concerning the photon noise of the light source 3.

Moreover, the simulation step 19 can additionally be influenced by specific further properties of a coating of the object to be measured and/or of a substrate onto which the object is imaged by the production system. Corresponding optical data may be absorption coefficients of an absorption layer and/or of a multilayer.

FIG. 4 elucidates the input variables that influence the simulation of the production aerial image I. They include a transfer function $T_{POB}$ of the production projection optical unit 22, the transfer function $T_{Mask}$ of the object structure 13 determined during the reconstruction step 18, and also the illumination conditions $E_{illu}$ (u, v) of the production illumination system 23 including the production illumination setting 19a. In this case, u, v are coordinates in the frequency domain. The simulation is illustrated schematically by the box 27 in FIG. 4.

Moreover, the determining method (identified schematically by the reference sign 28 in FIG. 4) can additionally be influenced by system-specific effects, namely aberrations, measured during preparation for the determining method during the adjustment of the system and during a calibration of the system, uniformity data and data concerning photon noise, which are estimated from the data of the measurement aerial image I (x, y) and optionally concomitantly included in the calculation. This step of including system-specific effects is illustrated at 24 in FIG. 4. Overall, the determined aerial image $I=\Sigma|_1 E_I^2|$ of the object 12 to be measured arises as a result of the illumination and imaging with illumination and imaging conditions of the optical projection system with the production projection optical unit 22 in accordance with the following formula:

$$E_I(x,y)=FT^{-1}[T_{POB} \times FT[T_{mask}(x',y') \times FT^{-1}[E_{illu}(u,v)]]]$$

In this case, FT denotes Fourier transformation, $FT^{-1}$ denotes inverse Fourier transformation. u and v denote pupil coordinates of the production illumination setting 19a and of the production projection system 23, respectively, in the frequency domain.

The determining method makes it possible, for example, with the aid of a measurement illumination setting 5 which can be realized with a setting stop 7 producible with comparatively low outlay, to carry out an aerial image determination (identified schematically by the reference sign 29 in FIG. 4) for a significantly more complex production illumination setting in the manner of the illumination setting 19a. The design requirements in respect of the setting stops 7 of the metrology system 2 are thus reduced. The measurement aerial image I is captured in three dimensions. For this purpose, the object 12 is displaced step by step in the z-direction with the aid of an object displacement device 12a, which is illustrated schematically in FIG. 1, such that on the basis of the imaging transfer of this z-displacement from the object plane 11 into the image plane 15, a plurality of 2D aerial images I (x, y, $z_i$) are generated for z-steps $z_i$ in the region around the image plane 15. A 3D measurement aerial image (I (x, y, z)) then arises from the plurality of 2D aerial images. The image plane 15 is also referred to as measurement plane.

What is claimed is:

1. A method for determining a production aerial image of an object to be measured as a result of an illumination and imaging with illumination and imaging conditions of an optical production system, comprising the following steps:
   capturing a measurement aerial image of the object to be measured with illumination and imaging conditions of an optical measurement system, which conditions include a predefined measurement illumination setting, wherein data of the measurement aerial image are generated during the capturing,
   reconstructing an object structure of the object to be measured from the data of the captured measurement aerial image by use of a reconstruction algorithm, wherein data of the reconstructed object structure are generated during the reconstructing, and
   simulating the production aerial image from the data of the reconstructed object structure with the illumination and imaging conditions of the optical production system, which conditions include a production illumination setting, which is different than the measurement illumination setting.

2. The method of claim 1, wherein the measurement illumination setting is predefined by a setting stop.

3. The method of claim 2, wherein the production illumination setting has an elliptic edge contour of an illumination pupil.

4. The method of claim 2, wherein the production illumination setting comprises a freeform or source mask optimization (SMO) illumination setting.

5. The method of claim 1, wherein the production illumination setting has an elliptic edge contour of an illumination pupil.

6. The method of claim 1, wherein the production illumination setting is a freeform or source mask optimization (SMO) illumination setting.

7. The method of claim 1, wherein the production illumination setting has an illumination intensity over illuminated regions of an illumination pupil which varies in the range between a minimum illumination intensity and a maximum illumination intensity, wherein the minimum illumination intensity is greater than 0.

8. The method of claim 1, wherein the production illumination setting has a multiplicity of illuminated individual regions within an illumination pupil.

9. The method of claim 8, wherein each of the illuminated individual regions has the same typical diameter.

10. The method of claim 8, wherein the illuminated individual regions are arranged in a manner distributed irregularly over the illumination pupil.

11. The method of claim 8, wherein the illuminated individual regions are arranged in a manner distributed over the illumination pupil with varying surface density.

12. A metrology system comprising an optical measurement system configured to carry out the method of claim 1,
    comprising an illumination system comprising an illumination optical unit for illuminating the object to be examined with a predefined illumination setting,
    comprising an imaging optical unit for imaging a section of the object into a measurement plane, and
    comprising a spatially resolving detection device, arranged in the measurement plane.

13. The metrology system of claim 12, comprising a changeable setting stop for predefining the measurement illumination setting.

14. The metrology system of claim 12, wherein the production illumination setting comprises an elliptic edge contour of an illumination pupil.

15. The metrology system of claim 12, wherein the production illumination setting is a freeform or source mask optimization (SMO) illumination setting.

16. The metrology system of claim 12, wherein the production illumination setting has an illumination intensity over illuminated regions of an illumination pupil which varies in the range between a specified lower illumination intensity and a specified higher illumination intensity, wherein the specified lower illumination intensity is greater than 0.

17. The metrology system of claim 12, wherein the production illumination setting has a multiplicity of illuminated individual regions within an illumination pupil.

18. The metrology system of claim 12, wherein each of the illuminated individual regions has substantially the same diameter.

19. The metrology system of claim 12, wherein the illuminated individual regions are arranged in a manner distributed irregularly over the illumination pupil.

20. The metrology system of claim 12, wherein the illuminated individual regions are arranged in a manner distributed over the illumination pupil with varying surface density.

* * * * *

UNITED STATES PATENT AND TRADEMARK OFFICE
CERTIFICATE OF CORRECTION

PATENT NO. : 12,288,272 B2
APPLICATION NO. : 17/547762
DATED : April 29, 2025
INVENTOR(S) : Martin Dietzel and Renzo Capelli It is certified that error appears in the above-identified patent and that said Letters Patent is hereby corrected as shown below:

In the Specification

Column 7
Line 40, delete "$I=\Sigma|_1E_I^2|$" and insert -- $I=\Sigma|E_I^2|$ --

Signed and Sealed this
Eighth Day of July, 2025

Coke Morgan Stewart
*Acting Director of the United States Patent and Trademark Office*